(12) United States Patent
Neyts et al.

(10) Patent No.: US 10,674,573 B2
(45) Date of Patent: Jun. 2, 2020

(54) LIGHT EMISSION DEVICE WITH ANISOTROPIC PROPERTIES

(71) Applicant: UNIVERSITEIT GENT, Ghent (BE)

(72) Inventors: Kristiaan Neyts, Ghent (BE); Michiel Callens, Ghent (BE); Daisuke Yokoyama, Yamagata (JP)

(73) Assignee: UNIVERSITEIT GENT, Ghent (BE)

( * ) Notice: Subject to any disclaimer, the term of this patent is extended or adjusted under 35 U.S.C. 154(b) by 0 days.

(21) Appl. No.: 15/532,641

(22) PCT Filed: Dec. 2, 2015

(86) PCT No.: PCT/EP2015/078282
§ 371 (c)(1),
(2) Date: Jun. 2, 2017

(87) PCT Pub. No.: WO2016/087486
PCT Pub. Date: Jun. 9, 2016

(65) Prior Publication Data
US 2017/0374721 A1    Dec. 28, 2017

(30) Foreign Application Priority Data

Dec. 2, 2014   (EP) .................................. 14195980

(51) Int. Cl.
*H05B 33/14* (2006.01)
*H01L 51/52* (2006.01)
(Continued)

(52) U.S. Cl.
CPC ....... *H05B 33/14* (2013.01); *G02F 1/133634* (2013.01); *H01L 51/0012* (2013.01); *H01L 51/442* (2013.01); *H01L 51/447* (2013.01); *H01L 51/5012* (2013.01); *H01L 51/5203* (2013.01); *H01L 51/5268* (2013.01); *H01L 51/5271* (2013.01); *H01L 51/5275* (2013.01); *H01L 51/5293* (2013.01);
(Continued)

(58) Field of Classification Search
None
See application file for complete search history.

(56) References Cited

U.S. PATENT DOCUMENTS

| 2005/0001543 A1 | 1/2005 | Nomura et al. |
| 2005/0104075 A1 | 5/2005 | Evans et al. |

(Continued)

FOREIGN PATENT DOCUMENTS

| EP | 2709184 A2 | 3/2014 |
| WO | 2007033490 A1 | 3/2007 |

OTHER PUBLICATIONS

Yokoyama, Daisuke, et al. "Horizontal molecular orientation in vacuum-deposited organic amorphous films of hole and electron transport materials." Applied Physics Letters 93.17 (2008): 394.*

(Continued)

*Primary Examiner* — Walter H Swanson
*Assistant Examiner* — Kien C Ly
(74) *Attorney, Agent, or Firm* — Workman Nydegger

(57) ABSTRACT

An organic light emitting diode comprises a hole transport layer, an emissive layer, and an electron transport layer. The hole transport layer and optionally the electron transport layer is made of a material having a refractive index having a specific anisotropy.

10 Claims, 11 Drawing Sheets

(51) Int. Cl.
  *G02F 1/13363* (2006.01)
  *H01L 51/44* (2006.01)
  *H01L 51/00* (2006.01)
  *H01L 51/50* (2006.01)
(52) U.S. Cl.
  CPC ...... *G02F 2202/36* (2013.01); *H01L 51/5056* (2013.01); *H01L 51/5072* (2013.01)

(56) References Cited

U.S. PATENT DOCUMENTS

| | | | | |
|---|---|---|---|---|
| 2011/0291080 | A1* | 12/2011 | Schmid | H01L 51/5012 257/40 |
| 2014/0151678 | A1* | 6/2014 | Sakuma | H01L 51/5271 257/40 |
| 2015/0069352 | A1* | 3/2015 | Kim | H01L 51/5004 257/40 |
| 2015/0280153 | A1* | 10/2015 | Sakaguchi | H01L 51/0097 359/489.07 |
| 2015/0344776 | A1* | 12/2015 | Bootman | C09K 11/025 252/301.36 |

OTHER PUBLICATIONS

European Search Report From Application No. 14195980.9, dated Sep. 7, 2015.
Kim et al., "Highly Efficient Inverted Top Emitting Organic Light Emitting Diodes Using a Horizontally Oriented Green Phosphorescent Emitter", Organic Electronics vol. 15, 2014, pp. 2715-2718.
International Search Report From PCT Application No. PCT/EP2015/078282, dated Feb. 4, 2016.
Kim et al., "Organic Light-Emitting Diodes With 30% External Quantum Efficiency Based on a Horizontally Oriented Emitter", Advanced Functional Materials vol. 23, 2013, pp. 3896-3900.
Lin et al., "Anisotropic Optical Properties and Molecular Orientation in Vaccum-Deposited Ter(9,9-Diary/Fluorene)s Thin Films Using Spectroscopic Ellipsometry", Journal of Applied Physics vol. 95, No. 3, Feb. 1, 2004, pp. 881-886.
Lussem et al., "Doping of Organic Semiconductors", Physica Status Solidi A vol. 210, No. 1, 2013, pp. 9-43.
Penninck et al., "Dipole Radiation Within One-Dimensional Anisotropic Microcavities: A Simulation Method", Optics Express vol. 19, No. 19, Sep. 12, 2011, 20 Pages.
Yokoyama et al., "Enhancement of Electron Transport by Horizontal Molecular Orientation of Oxadiazole Planar Molecules in Organic Amorphous Films", Applied Physics Letters vol. 95 No. 24, 2009, 3 Pages.
Yokoyama et al., "Molecular Orientation in Small-Molecule Organic Light-Emitting Diodes", Journal of Materials Chemistry vol. 21, 2011, pp. 19187-19202.
Yokoyama et al., "Horizontal Orientation of Linear-Shaped Organic Molecules Having Bulky Substituents in Neat and Doped Vacuum-Deposited Amorphous Films", Organic Electronics vol. 10, 2009, pp. 127-137.
Yokoyama et al., "In Situ Real-Time Spectroscopic Ellipsometry Measurement for the Investigation of Molecular Orientation in Organic Amorphous Multilayer Structures", Journal of Applied Physics vol. 107, 2010, 7 Pages.
Yokoyama et al., "Horizontal Molecular Orientation in Vacuum-Deposited Organic Amorphous Films of Hole and Electron Transport Materials", Applied Physics Letters vol. 93, 2008, 3 Pages.

\* cited by examiner

LIGHT EMISSION DEVICE WITH ANISOTROPIC PROPERTIES

FIELD OF THE INVENTION

The invention relates to the field of light emitting devices suitable for light emitters or displays. More specifically it relates to optimization of organic light emitting diodes.

BACKGROUND OF THE INVENTION

Organic Light Emitting Diodes (OLEDs) are luminescent devices comprising organic layers, such as polymers. Each of these layers serves a specific purpose. In the past, a lot of effort was directed to optimization of the properties of the materials forming the structure. Several colors have been obtained, for example layers capable of producing red, green, blue, or white (which is in some OLEDs obtained by stacking three layers of the RGB materials) emission. When an appropriate combination of layers and emitters is used one can make these devices generate light with almost 100% internal efficiency. Even though light can be generated which such high efficiencies only a relatively small portion can be extracted from the structure. Due to total internal reflection (TIR) at surfaces with media having a lower refractive index and coupling to plasmonic modes, a large portion of the light remains trapped inside the stack and is eventually absorbed. Thus only a small percentage of light trespasses the structure resulting in an overall efficiency typically reaching values as low as 20%.

Some efforts have been made towards improving the outcoupling, for example improving the transparency and purity of the layers of conductive oxides (which are necessary to create carriers within the organic layers).

Other improvements for the outcoupling efficiency of the substrate also have been obtained by using micro lenses or patterning, hence reducing effects like total internal reflection at the substrate. The outcoupling is then limited by the quality of the substrate patterning, and the costs may increase while negatively affecting certain aspects of the image (for example reducing the viewing angle).

Document WO2007033490 discloses a layer comprising a transparent conductive film with columnar microstructures for obtaining birefringence, improving the efficiency of LCDs. This document may be applied to OLEDs, because the contrast and image stability of displays can be improved, but the outcoupling, although it may be improved in some cases, is difficult to control, the production is costly, complex and difficult to implement in OLEDs, as thin structures are needed.

Another effect that has been studied for optimization of the outcoupling efficiency is the orientation of the emitting elements. In "Optical design for efficient light emission in OLEDs and anisotropic layers", SPIE Organic+ Electronics International Society for Optics and Photonics 2013, Penninck and Neyts describe the effect of the orientation of the emitting center behaving as electrical dipole antennas with respect to the substrate, on the outcoupling efficiency. It was found that when the dipole moment of the luminescent transition was parallel with the substrate, a higher outcoupling efficiency was obtained.

Nevertheless, there is still room for improvement of the outcoupling efficiency of OLED devices.

SUMMARY OF THE INVENTION

It is an object of embodiments of the present invention to provide a good and efficient outcoupling of an OLED.

The above object is obtained by a device or method according to the present invention.

The present invention relates to an Organic Light Emitting Diode for emitting radiation, the organic light emitting diode comprising
  a hole transport layer,
  an emissive layer comprising horizontally oriented emitters whereby the emitters are oriented parallel with the interfaces between the different layers or randomly oriented emitters whereby a mixture of emitters oriented in parallel and oriented perpendicular to the interfaces between the different layers occurs and
  an electron transport layer,
  wherein the hole transport layer is made of a material having a refractive index having a positive anisotropy.

The emissive layer may comprise horizontally oriented emitters or randomly oriented emitters and the hole transport layer may be made of a material having a refractive index having a positive anisotropy of at least 0.1, advantageously at least 0.2.

The OLED structure may be a bottom emitting structure, the structure comprising a transparent substrate and emitting through the substrate.

The emitters may be organic dipole emitters.

The emitters may be nano-crystalline quantum dots.

The electron transport layer may be made of a material having a refractive index having a negative anisotropy. It is an advantage of embodiments of the present invention that the outcoupling can be increased by selecting an electron transport layer showing a specific anisotropy in the refractive index resulting in reduced total internal reflectance. It is an advantage of embodiments of the present invention that electron transport layers having suitable optical properties are available on the market or can be manufactured.

The electron transport layer may be made of a material having a refractive index having a negative anisotropy of at least −0.1, advantageously at least −0.2. It is an advantage of embodiments of the present invention that a plurality of materials can be used for providing an electron transport layer having a negative anisotropy in the refractive index.

The OLED may further comprise electrodes. Such electrodes may be made of low work function materials. It is an advantage of embodiments of the present invention that the production of charge carriers may be effective. The OLED also may comprise a substrate. Such a substrate may have birefringent properties. It is an advantage of embodiments of the present invention that highly polarized light may be obtained, improving image characteristics such contrast. The anisotropic layers may have an ordinary refractive index of 1.7. It is an advantage of embodiments of the present invention that organic materials with required properties can be easily obtained or manufactured.

The present invention also relates to an optical appliance comprising an organic light emitting diode as described above.

The present invention furthermore relates to a method for designing an Organic Light Emitting Diode for emitting radiation, the method comprising
  selecting a hole transport layer, an emissive layer and an electron transport layer from a set of hole transport layer materials, a set of emissive layers and a set of electron transport layers,
  simulating the external outcoupling efficiency of an organic light emitting diode as function of optical parameters defined by the selected hole transport layer, emissive layer and electron transport layer, and if said external outcoupling efficiency is above a certain threshold, using said selected hole transport layer, emissive layer and electron transport layer in the design of the Organic Light Emitting Diode, wherein said selecting a hole transport layer comprises selecting a hole transport layer having a refractive index with a positive anisotropy and selecting an emissive layer comprises selecting an emissive layer comprising horizontally oriented emitters or randomly oriented emitters.

Said selecting an electron transport layer may comprise selecting an electron transport layer having a refractive index with negative anisotropy.

Designing may comprise repeating said selecting and simulating for a plurality of sets of a hole transport layer, emissive layer and electron transport layer, and wherein the set corresponding with the highest external output efficiency is used in the design of the OLED.

The present invention also relates to a method for manufacturing an OLED.

The method comprises depositing a first electrode, a hole transport layer, an emissive layer, an electron transport layer and a second electrode, wherein depositing an emissive layer comprises depositing an emissive layer comprising horizontally oriented emitters oriented parallel with the interfaces between the different layers or randomly oriented emitters being a mixture of emitters oriented in parallel and oriented perpendicular to the interfaces between the different layers, and depositing a hole transporting layer comprises depositing a hole transport layer having a refractive index with positive anisotropy.

Depositing an electron transport layer comprises depositing an electron transport layer (105) having a refractive index with negative anisotropy.

The present invention also relates to a computer program product or a data carrier comprising a set of instructions for, when executed on a computer, performing a method for designing an OLED as described above.

The present invention furthermore relates to the transmission of a computer program product as described above over a local or wide area network.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
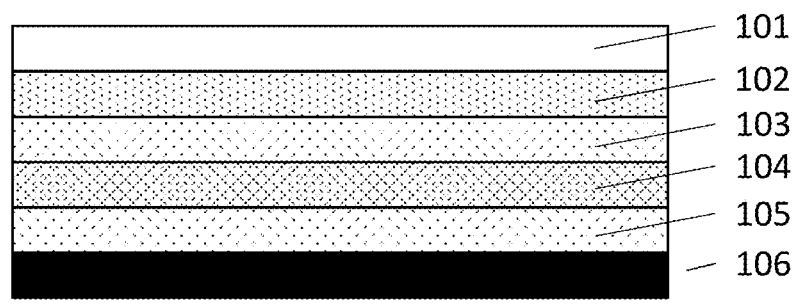
FIG. 1 illustrates a schematic layer structure of an OLED according to some embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "transparent", reference is made to a material property which indicates that at least 50% of incident light passes through the material, for example at least 80% of the radiation may not be reflected or absorbed and may traverse the whole thickness of the material.

Where in embodiments of the present invention reference is made to "hole", reference is made to an electron hole in a band structure. It is considered a charge carrier equivalent to the electron, but with positive charge. In certain embodiments of the present invention, holes are provided by electric polarization of a hole-injection layer, which will be referred to as "anode", being one of the electrodes.

Where in embodiments of the present invention reference is made to a hole transport layer (HTL), reference is made to the layer or the combination of layers between the anode and the emitting layer. This may be a single hole transport layer but also encompasses a possible hole injection layer and/or an electron blocking layers. Even other additional layers may be encompassed. Similarly, where in embodiments of the present invention reference is made to an electron transport layer (ETL), this refers to the layer or the combination of layers between the cathode and the emitting layer. This may be single electron transport layer but also encompasses a possible electron injection layer, a hole blocking layer or other layers.

Where in embodiments of the present invention reference is made to anisotropy, reference is made to the difference in refractive index between the extra-ordinary refractive index $n_e$ and the ordinary refractive index $n_o$, given by $$\Delta n = n_e - n_o.$$

Determination or measurement of the anisotropy in refractive index can be performed with techniques known to the person skilled in the art. By way of illustration, embodiments of the present invention not being limited thereto, some known techniques are referred to hereafter. For example, in Applied Physics Letters 93 (2008) 173302, Yokoyama et al describes the use of variable angle spectroscopic ellipsometry for determining the anisotropy of materials. Also in Journal of Applied Physics 107 (2010) 123512, Yokoyama et al describe a spectroscopic ellipsometry technique for determining the refractive index (and anisotropy thereof). In Organic Electronics 10 (2009) 127, Yokoyama et al. describes, besides the variable angle spectroscopic ellipsometry, a further technique for determining anisotropy of the refractive index, more particularly cutoff emission measurements. Both these methods can be used for determining anisotropy in the refractive index. Also in Journal of Applied Physics 95 (3) (2004) 881, Lin et al. describe how to determine anisotropy in the refractive index using spectroscopic ellipsometry. Summarized, a number of techniques exist for determining anisotropy in the refractive index of materials and these can be used for selecting materials when applying methods and systems according to embodiments of the present invention. Such techniques are known to the skilled person. One such reference technique may be spectroscopic ellipsometry.

In a first aspect, the present invention relates to an organic light emitting diode (OLED) for emitting radiation. According to embodiments of the present invention, the organic light emitting diode comprises a hole transport layer, an emissive layer and an electron transport layer (105). OLEDs according to embodiments of the present invention, typically may be built up of a layered stack between an anode and a cathode, the layered stack comprising emitters in the emissive layer, for example an electroluminescent layer (Emissive Layer, EML). The emissive layer typically is positioned between two charge carrier transport layers, for example an Electron Transport Layer (ETL) and a Hole Transport Layer (HTL).

According to embodiments of the present invention, the emissive layer comprises horizontally oriented emitters whereby the emitters are oriented parallel with the interfaces between the different layers, vertically oriented emitters whereby the emitters are oriented perpendicular to the interfaces between the different layers or randomly oriented emitters whereby a mixture of emitters oriented in parallel and oriented perpendicular to the interfaces between the different layers occurs. Furthermore, according to embodiments of the present invention, the hole transport layer is made of a material having a refractive index having a positive anisotropy for an emissive layer comprising horizontally oriented emitters or randomly oriented emitters, or the hole transport layer is made of a material having a refractive index having a negative anisotropy for an emissive layer comprising vertically oriented emitters.

According to some embodiments of the present invention, the electron transport layer furthermore may be made of a material having a refractive index having a negative anisotropy. The present invention is not limited to the described features: for example other layers may be comprised in the stack, also one or more of the layers may comprise sublayers. When reference is made to emissive layer, or EML, reference is made to any emitter between the transport layers, whereby the emissive layer may comprise an actual layered structure or not.

In embodiments of the present invention, the selection of materials may be performed by testing the anisotropy in refractive index using a method as described above, or by selecting materials for which the anisotropy in refractive index is already known from literature. Materials for the HTL or ETL can be selected from those reported by Yokoyama in Applied Physics Letters 93 (2008) 173302, in Journal of Applied Physics 107 (2010) 123512, in Organic Electronics 10 (2009) 127 or in Journal of Materials Chemistry 21 (2011) 19187.

FIG. 1 shows an OLED stacked structure 100 according to some embodiments of the present invention, for example suitable for a pixel, comprising a transparent substrate 101, for example an optically thick glass. The substrate in embodiments of the present invention may be a layer or multilayer of transparent material attached to at least one electrode (either cathode or anode), for example glass, flexible transparent film, suitable for flexible displays In certain embodiments of the present invention, two transparent substrates may be attached to both electrodes, which is suitable for transparent displays if both cathode and anode are transparent. In certain embodiments of the present invention, it may give structural stability and mechanical resistance to wear, corrosion and other negative environmental influences. It may also have tailored optical properties such birefringence, anisotropy, etc., the present invention not being limited thereto. The substrate or substrates may comprise patterning or other texturization for further reducing the effect of total internal reflection.

In embodiments of the present invention, the anode layer in the diode may be a conductor which provides holes to the electroluminescent layer. In certain, non-limiting embodiments, the anode layer may be attached to a transparent substrate, for example a transparent polymer, glass, or any other transparent material with appropriate mechanical properties; in this case it is advantageous that the anode layer comprises a transparent electrode, for example a thin layer of gold deposited on a substrate, for example a wide-bandgap semiconductor, a transparent oxide, the present invention not being limited to said materials. Examples of suitable oxides include Indium Tin Oxide (ITO), Fluorine-doped Tin Oxide (FTO), or zinc oxide, titanium oxide, gallium or cadmium oxide layers, or a combination thereof, the present invention not being limited thereto. The anodic layer 102 may be transparent and isotropic in this example.

In embodiments of the present invention, a cathode layer may be present comprising a conductive material which provides electrons to an electroluminescent layer. In certain embodiments of the present invention, the cathode may be transparent, in which case the cathode layer can be attached to a transparent substrate or may be shielded and isolated from the air and moisture, although the present invention is not limited thereto. Some examples may be cesium-incorporated ITO or thin LiF/al/Al-doped SiO multilayers. Alternatively, the cathode may block light, or even reflect light. For example silver (Ag) or aluminum (Al) may be used as a cathode layer, or a combination of materials, for example Ag/Ba bilayers, the present invention not being limited to said examples. In some embodiments the cathode surface may be reflective, increasing overall outcoupling since a microcavity is formed. The electrode layer 106 may be integrated in a circuit of a display, a TFT matrix, etc.

Between the cathode and the anode, embodiments of the present invention may comprise at least three stacked layers. The stack typically comprises at least a hole injecting buffer layer or hole transport layer HTL, an emissive layer EML and an electron transport layer ETL, the HTL being in electrical contact with the anode, the ETL being in electrical contact with the cathode, and both HTL and ETL being in contact with the emissive layer EML. These layers, in embodiments of the present, are thin organic layers forming the carrier transport and photon emission layers in the present example. The Hole Transport Layer HTL 103 may transport the positive charge carriers (holes) from the electrode layer 102 to the emissive layer EML 104. Analogously, the Electron Transport Layer ETL 105 may transport electrons from the electrode layer 106 to the EML 104.

According to embodiments of the present invention, the hole transport layer according to embodiments of the present invention also may be anisotropic for the refractive index. The type of anisotropy for the refractive index typically may depend on the emitters in the emissive layer. In some embodiments wherein the emissive layer comprises horizontally oriented emitters, e.g. dipole organic emitters, or randomly oriented emitters, e.g. dipole organic emitters, the hole transport layer advantageously is made of a material having a refractive index having a positive anisotropy. The material may have a refractive index having a positive anisotropy of at least 0.1, advantageously at least 0.2. Such layers may for example be obtained by heating the substrate during deposition to a temperature higher than the glass transition temperature or depositing the layer at very high rates. An exemplary material, embodiments not being limited thereto is BSB-CZ.

In some embodiments wherein the emissive layer comprises vertically oriented emitters, e.g. dipole organic emitters, the hole transport layer advantageously is made of a material having a refractive index having a negative anisotropy. The material may have a refractive index having a negative anisotropy of at least −0.1, advantageously at least −0.2.

In some embodiments of the present invention, also the ETL comprises anisotropic materials, more specifically anisotropic materials having a negative anisotropy for the refractive index. The electron transport layer may be made of a material having a refractive index having a negative anisotropy of at least −0.1, advantageously at least −0.2. For example, it may comprise negative anisotropic organic materials, like particular polymers, for example BSB-CZ, for example Bpy-OXD, or B3PYMPM, the present invention not being limited thereto. It may also comprise materials with variable anisotropy, for example anisotropy which may be controlled by application of mechanical stress or electric field.

The emissive layer EML may comprise isotropic materials, anisotropic materials, or a combination of both. In embodiments of the present invention, EML comprise luminescent material, for example organometallic compounds, anthracenes, naftalenes, heterocyclic compounds like porphyrins, pyrenes, for example a combination thereof. The EML may comprise sublayers, for example in the case of D-EML (double emission layer), for example comprising triazole derivatives (e.g. TAZ:TCTA-Ir(ppy)-3). EML may be red, green, blue, white OLED, not being limited thereto, and it may be stacked EML. The present invention is not limited to organic emitters, and different embodiments of the present invention may comprise other types of emitters, for example nanocrystals, e.g. CdSe.

Figure 2:
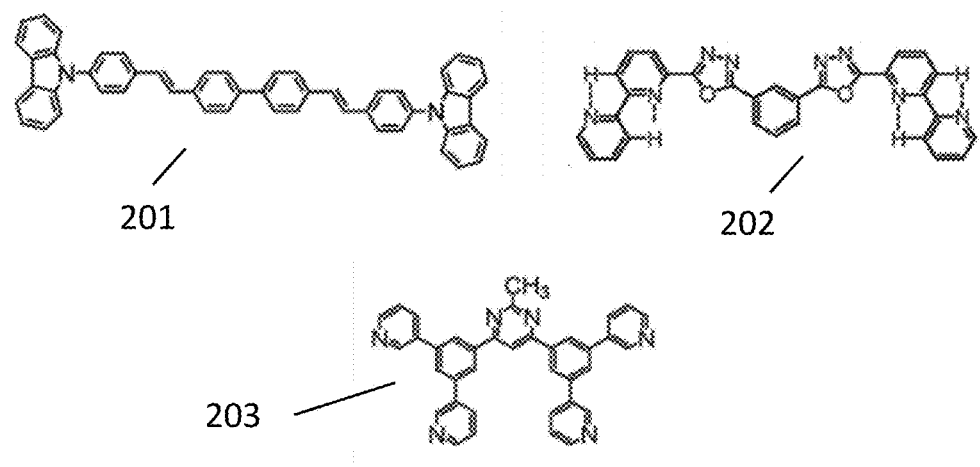
FIG. 2 illustrates three exemplary molecules of materials suitable for use in embodiments according to the present invention.

Anisotropic layers may be obtained, for example, by using polymeric material with oblong or disk-shaped molecules. The organic layers may for example be uniaxial, the c-axis perpendicular to the substrate. FIG. 2 shows three exemplary small molecules suitable for anisotropic layers, 4,4'-Bis (4-(9H-carbazol-9-yl) styryl) biphenyl or BSB-CZ 201, [1,3-Bis[2-(2,2'-bipyridine-6-yl)-1,3,4-oxadiazo-5-yl] benzene or Bpy-OXD 202 and [4,6-Bis (3,5-di(pyridin-3-yl) phenyl)-2-methylpyrimidine] or B3PYMPM 203. Any other material resulting in good anisotropic optical properties is suitable for embodiments of the present invention.

The present invention is not limited to the above described stacking structure. For example, in some embodiments the EML may contain sublayers, for example the EML may comprise a double emissive layers (D-EML), or a stack of three emissive layers of different colors, as in the case of some white OLEDs. An extra layer between the emissive layer and the charge carrier transport layer may be added, e.g. an (opposite) charge carrier blocking layer, so for example electrons do not escape from the EML to the HTL (by addition of an electron blocking layer) and holes do not escape from the EML to the ETL (by addition of a hole blocking layer).

The general mechanism of OLED operation is known in the prior art: an electrical field between the electrodes creates charge carriers of opposite sign in the ETL and HTL, which are moved to the EML and recombine with photonic emission. For example, the electroluminescence mechanism of the EML may be phosphorescence (decay of triplet and singlet excitations, in EML comprising organometallic compounds), or for example fluorescence (decay of singlet excitations, in EML comprising for instance Alq3, consisting of quinolone rings), or both if the EML is mixed. The photon, in order to be viable, must reach the substrate through several layers of materials. It is an advantage of embodiments of the present invention that a careful tailoring of the ordinary and extraordinary refraction indices of the layers may reduce internal reflection and improve outcoupling. The present invention may be suitable for passive and active matrix OLEDs (PMOLED, AMOLED), for the so-called "Transparent OLED", either PMOLED or AMOLED, provided that the cathode is transparent (as the HTL and ETL can be transparent to light). The present invention may also be suitable for top-emitting OLED, e.g. top-emitting AMOLED, or for transparent cathode and reflective substrate. It may also be suitable for RGB OLEDs, stacked OLED, and white OLED, the present invention not being limited thereto. The EML may be also comprise polymeric material. It may also comprise nanocrystalline material, hence the present invention may be suitable for quantum-dot LEDs (QDLED).

By way of illustration, embodiments of the present invention not being limited thereto, some exemplary structures as can be used are described in the table below indicating exemplary values for an OLED structure. The exemplary OLED structure for which the parameters are described have the following structure: an aluminum layer, an electron transport layer (ETL), an emissive layer (EML), a hole transport layer (HTL) and an electrode (ITO). For the different layers, the thickness, the extra-ordinary and ordinary refractive index are given, as well as the overall outcoupling efficiency. Examples are given for random emitters, horizontal emitter and vertical emitters.

TABLE 0 exemplary structures

Random emitters

| | Layer | | | | |
|---|---|---|---|---|---|
| | Aluminum | ETL | EML | HTL | ITO |
| Thickness | 100 nm | 75 nm | 10 nm | 118 nm | 77 nm |
| $n_e$ | 1 + 6i | 1.564 | 1.7 | 1.83 | 1.8 |
| $n_o$ | 1 + 6i | 1.764 | 1.7 | 1.63 | 1.8 |
| Outcoupling efficiency | | | 0.583 | | |

Horizontal emitters

| | Layer | | | | |
|---|---|---|---|---|---|
| | Aluminum | ETL | EML | HTL | ITO |
| Thickness | 100 nm | 57.5 nm | 10 nm | 138 nm | 77 nm |
| $n_e$ | 1 + 6i | 1.564 | 1.7 | 1.83 | 1.8 |
| $n_o$ | 1 + 6i | 1.764 | 1.7 | 1.63 | 1.8 |
| Outcoupling efficiency | | | 0.816 | | |

Vertical emitters

| | Layer | | | | |
|---|---|---|---|---|---|
| | Aluminum | ETL | EML | HTL | ITO |
| Thickness | 100 nm | 180 nm | 10 nm | 50 nm | 77 nm |
| $n_e$ | 1 + 6i | 1.83 | 1.7 | 1.564 | 1.8 |
| $n_o$ | 1 + 6i | 1.63 | 1.7 | 1.764 | 1.8 |
| Outcoupling efficiency | | | 0.515 | | |

In a second aspect, the present invention relates to a method for designing an Organic Light Emitting Diode for emitting radiation. The method may be especially suitable for designing an organic light emitting diode as described in the first aspect. According to embodiments of the present invention, the method comprises simulating the external outcoupling efficiency or a parameter related thereto of an organic light emitting diode as function of optical parameters defined by a hole transport layer, an emissive layer, and an electron transport layer of the organic light emitting diode design.

According to embodiments of the present invention, the method comprises selecting a hole transport layer, an emissive layer and an electron transport layer from a set of hole transport layer materials, a set of emissive layers and a set of electron transport layers, simulating the external outcoupling efficiency of an organic light emitting diode as function of optical parameters defined by the selected hole transport layer, emissive layer and electron transport layer, and, if said external outcoupling efficiency is above a certain threshold, using said selected hole transport layer, emissive layer and electron transport layer in the design of the Organic Light Emitting Diode. Simulating the external outcoupling efficiency as function of optical parameters may comprise simulating as function of the layer thicknesses for the different selected layers. Selecting a hole transport layer thereby comprises selecting a hole transport layer having a refractive index with a positive anisotropy, i.e. the set of hole transport layers is actively restricted to transport layers having a refractive index with a positive anisotropy.

The emissive layer may comprise horizontally oriented emitters oriented parallel with the interfaces between the different layers, vertically oriented emitters oriented perpendicular to the interfaces between the different layers or randomly oriented emitters being a mixture of emitters oriented in parallel and oriented perpendicular to the interfaces between the different layers.

In some embodiments, the method for designing comprises repeating said selecting and simulating for a plurality of sets of a hole transport layer, emissive layer and electron transport layer, and wherein the set corresponding with the highest external output efficiency is used in the design of the OLED.

Such a simulation may be performed using conventional simulation software, one example thereof being described in more detail in "Penninck L, De Visschere P, Beeckman J, Neyts K. Dipole radiation within one-dimensional anisotropic microcavities: a simulation method. Opt Express. 2011; 19 (19): 18558-76", embodiments of the present invention not being limited thereto. Since the simulation software has been described therein in detail, the details of the simulator as such are not repeated herein. The method according to embodiments of the present invention furthermore is characterized in that selecting an electron transport layer comprises selecting an electron transport layer having a refractive index with negative anisotropy. In other words, the design method thus restricts the optical parameter values to be used For said designing, the method may comprise selecting an electron transport layer material and/or a hole transport layer material from a database of materials, said selecting taking into account the required anisotropy for the specific layer. The method furthermore may comprise selecting other optical parameters such as thicknesses of the layers, optical properties of other layers, etc. Other method steps may be as known by the person skilled in the art when defining an OLED design.

In some embodiments, the method for designing comprises repeating said selecting and simulating for a plurality of sets of a hole transport layer, emissive layer and electron transport layer, and wherein the set corresponding with the highest external output efficiency is used in the design of the OLED.

The method for designing may be implemented in a computing device. Whereas the method has been described as a method for designing an OLED, the present invention also relates to a method for simulating the external optical efficiency of an OLED comprising a hole transport layer having a specific anisotropy for the refractive index, or any other optional feature as described above.

The above described method embodiments may correspond with an implementation of the method as a computer implemented invention in a processor. Such a processor includes at least one programmable computing component coupled to a memory subsystem that includes at least one form of memory, e.g., RAM, ROM, and so forth. It is to be noted that the computing component or computing components may be a general purpose, or a special purpose computing component, and may be for inclusion in a device, e.g., a chip that has other components that perform other functions. Thus, one or more aspects of the present invention can be implemented in digital electronic circuitry, or in computer hardware, firmware, software, or in combinations of them. While a processor as such is prior art, a system that includes the instructions to implement aspects of the methods designing an OLED is not prior art. The present invention thus also includes a computer program product which provides the functionality of any of the methods for designing or simulating an OLED according to the present invention when executed on a computing device. In another aspect, the present invention relates to a data carrier for carrying a computer program product. Such a data carrier may comprise a computer program product tangibly embodied thereon and may carry machine-readable code for execution by a programmable processor. The present invention thus relates to a carrier medium carrying a computer program product that, when executed on computing means, provides instructions for executing any of the methods for designing an OLED as described above. The term "carrier medium" refers to any medium that participates in providing instructions to a processor for execution. Such a medium may take many forms, including but not limited to, non-volatile media, and transmission media. Non-volatile media includes, for example, optical or magnetic disks, such as a storage device which is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fibre optics, including the wires that comprise a bus within a computer.

By way of illustration, embodiments of the present invention not being limited thereto, a number of simulations will be described further, illustrating features and advantages of embodiments of the present invention. The results discussed below may illustrate some of the theoretical principles behind the influence of anisotropy in refractive indices but these results nor the principles highlighted should be considered limiting for embodiments of the present invention.

In the following, advantageous values of parameters such as thickness or ordinary and extraordinary optical indices are presented through simulations. It is to be understood that explicit values of parameters are not limiting for embodiments of the present invention but are merely provided by way of illustration. Simulations have been performed on an OLED structure as shown in FIG. 1, in order to obtain the optimal values for layers thicknesses and refraction indices, for a given exemplary radiation (at 555 nm wavelength). Simulation software used may be as described in "Penninck L, De Visschere P, Beeckman J, Neyts K. Dipole radiation within one-dimensional anisotropic microcavities: a simulation method. Opt Express. 2011; 19 (19): 18558-76". The simulation takes into account radiation of dipole antennas inside a 1D microcavity, combined with the scattering matrix method.

The perpendicular contributions of the emission can be studied independently from the other directions, and it is only affected by each of the ordinary refractive indices $n_O$ and thicknesses of the layers. This way, it is possible to obtain the optimal thickness of the layers. The thickness and refractive indices of the different layers used in the simulation can be found in Table 1, and a description of their optimization is given below. After optimization, assuming isotropic refractive indices for the hole transport layer HTL and electron transport layer ETL, these thickness and refractive indices were frozen, and optimization of the ordinary and extraordinary refractive index of the HTL and ETL was performed for these frozen values for the thickness of all layers and refractive indices of all layers except the HTL and ETL layer.

TABLE 1

Parameters for layers in the OLED stack of FIG. 1 used in simulations of emission in the perpendicular direction.

| Material | Thickness | $n_o$ |
|---|---|---|
| Al 106 | 100 nm | 1 + 6 j |
| ETL 105 | 0-150 nm | 1.3 – 2.1 |
| EML 104 | 10 nm | 1.7 |
| HTL 103 | 0-150 nm | 1.3 – 2.1 |
| ITO 102 | 555 nm/(4*n) | 1.8 |
| GLASS 101 | optically thick | 1.5 |

The Al cathode is optically isotropic, but its refractive index presents an absorbance term (hence the refractive index of Al is an complex number). The thickness of the cathode was chosen according to typical values of reflective cathodes. The EML remained fixed to a thin layer (10 nm) having an isotropic refractive index of 1.7 although the present invention may comprise anisotropic EMLs. The ITO anode had a typical refractive index value of 1.8, with a thickness already optimized for maximization of emission in the vertical direction, in so far as the refractive index of the HTL is below 1.8. The substrate is an optically thick, isotropic glass, chosen according to a typical OLED display found in the prior art. The charge carrier transport layers, on the other hand, were changed within a range of 150 nm or less thickness and an index between 1.3 and 2.1, in order to optimize the amplitude of the Poynting vector perpendicular to the substrate. This optimization was limited to the first local maximum with the thinnest ETL and HTL layers.

Figure 3:
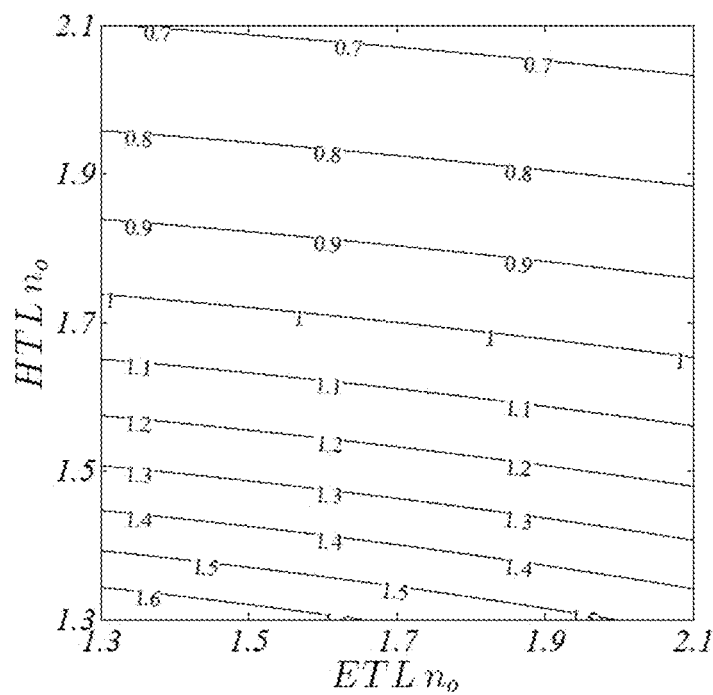
FIG. 3 shows a simulation of the amplitude of the Poynting vector towards the substrate according to some embodiments of the present invention, as a function of the ordinary refractive indices of the ETL and HTL.

The result of the optimization of the amplitude of the Poynting vector can be seen in FIG. 3, representing the relative value of the emission in the vertical direction (direction towards the transparent substrate) as a function of $n_O$ of the ETL and HTL. The thickness was varied for the isotropic case ($n_O=n_E=1.7$ for the ETL, EML and HTL) and the optimal thickness for the first local maximum were fixed for the rest of calculations (as it can be seen in Table 2). A weak dependency on the refractive index of the ETL was observed because the processes between the EML and the cathode are dominated by the optical characteristics of the reflective cathode. The advantageous values for the extraction efficiency in the vertical direction can be increased by about 30% if the $n_O$ of the HTL is reduced to 1.5. On the other hand, increasing $n_O$ to 2.1 leads to a drop of more than 30%.

Once the optimal values of thickness and $n_O$ were chosen for the transport layers, the optimal values for $n_E$ were obtained. Table 2 shows the values and range of values chosen for the simulation of the total radiation that is emitted into the substrate, henceforth called the extraction efficiency.

TABLE 2

Parameters for the layers in the OLED stack of FIG. 1 to investigate the effect of changing $n_E$ on simulations of extraction efficiency

| Material | Thickness | $n_o$ | $n_e$ |
|---|---|---|---|
| Al 106 | 100 nm | 1 + 6 j | 1 + 6 j |
| ETL 105 | 54 nm (optimized) | 1.7 | 1.3 – 2.1 |
| EML 104 | 10 nm | 1.7 | 1.7 |
| HTL 103 | 115 nm (optimized) | 1.7 | 1.3 – 2.1 |
| ITO 102 | 555 nm/(4*n) | 1.8 | 1.8 |
| GLASS 101 | optically thick | 1.5 | 1.5 |

Figure 4:
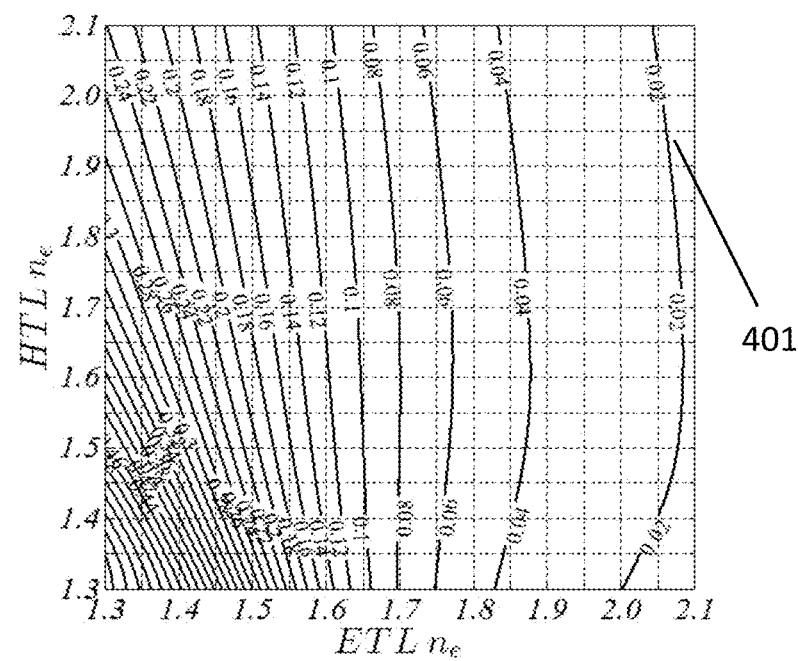
FIG. 4 shows a simulation of the integrated emission from the EML for dipoles oriented towards the substrate (vertical orientation) for $n_E$ in the HTL and ETL, as can be used in embodiments of the present invention.
Figure 5:
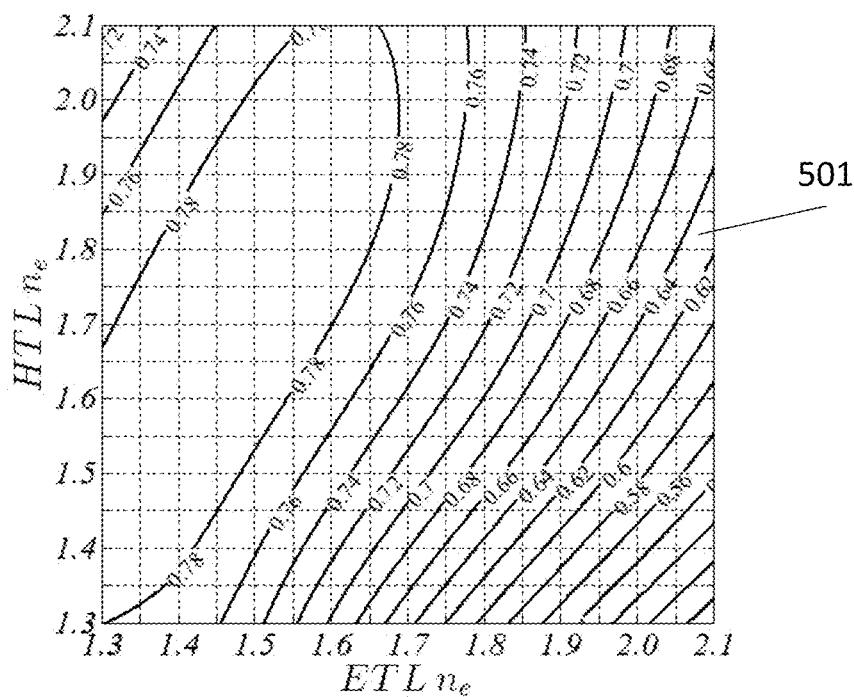
FIG. 5 shows a simulation of the integrated emission from the EML for dipoles perpendicular to the substrate (horizontal orientation) for $n_E$ in the HTL and ETL, as can be used in embodiments of the present invention.
Figure 6:
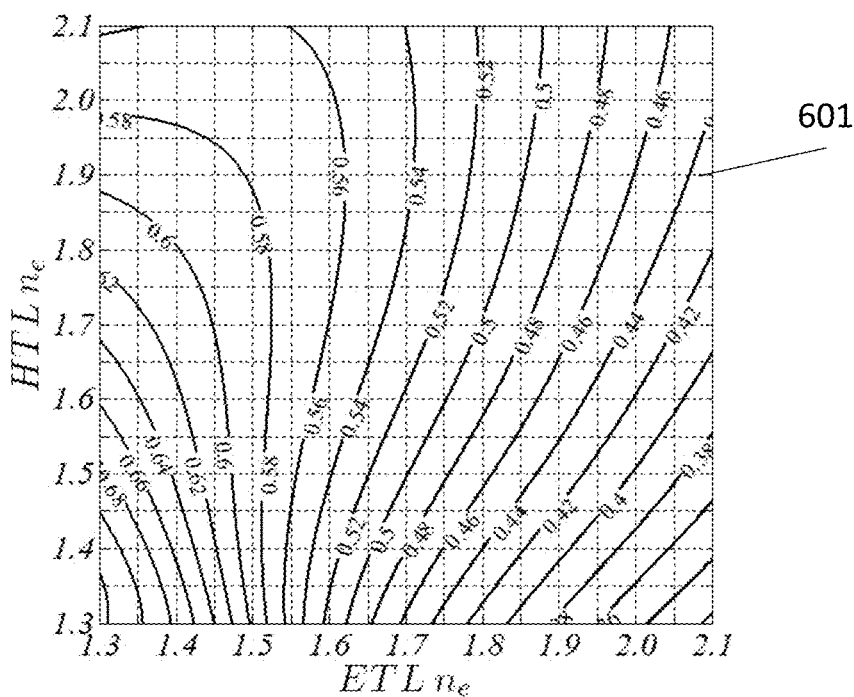
FIG. 6 shows a simulation of the integrated emission from the EML for randomly oriented dipoles for $n_E$ in the HTL and ETL, as can be used in embodiments of the present invention.

The $n_E$ of both transport layers is varied between 1.3 and 2.1 and the integrated emission of electrical dipoles in the EML towards the substrate 101 were calculated for three different dipole orientations:

the first orientation of the dipoles is perpendicular to the interfaces (vertical orientation). The result of the calculations made for the points on the grid can be seen in FIG. 4.

the other two are mutually orthogonal and parallel to the interfaces. These two are averaged, representing the horizontal orientation. Considering the rotational symmetry, these form a complete set, shown in FIG. 5.

the emission for randomly oriented dipoles can be found by averaging with weights ⅔ and ⅓ for the horizontal and vertical orientation respectively. FIG. 6 shows the extraction efficiency for randomly oriented dipoles.

The contour lines 401, 501 and 601 are obtained via interpolation.

It can be inferred, for randomly oriented dipoles, that the extraction efficiency depends weakly on the $n_E$ of the HTL, and a low $n_E$ value of the ETL increases the extraction efficiency. On the other hand, for horizontally oriented dipoles, the extraction efficiency depends strongly on the $n_E$ of the HTL (high values give better performance).

It is an advantage that anisotropic layers allow a low $n_O$ value and a high $n_E$ value for HTL, obtaining an optimal extraction efficiency in horizontally oriented dipoles, which cannot be obtained in isotropic materials.

Figure 7:
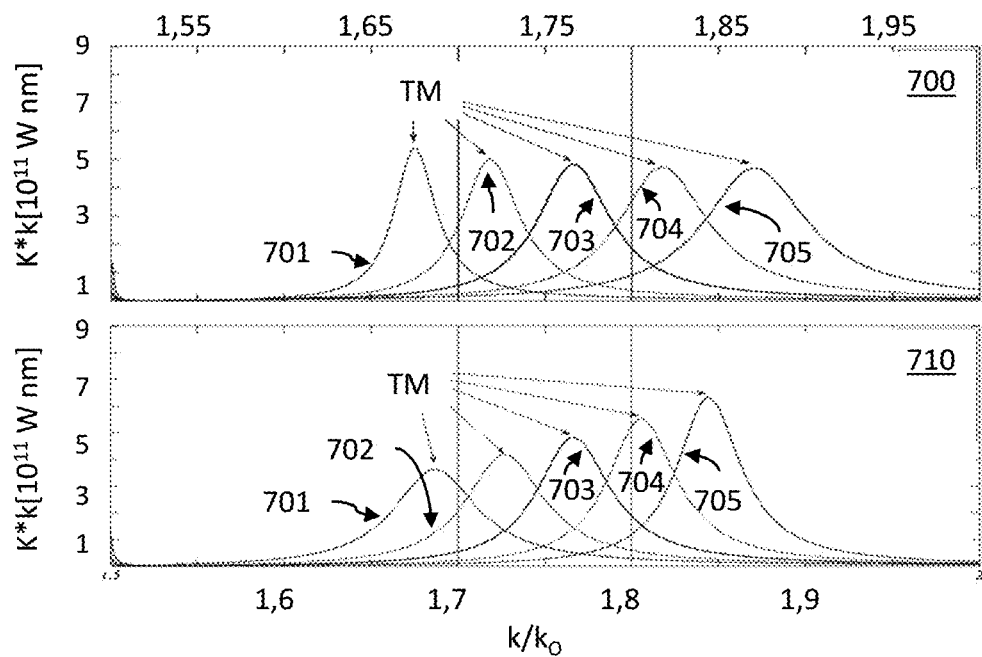
FIG. 7 shows two graphs illustrating a simulation of an emission distribution with vertical dipole orientation, for ETL and HTL, as can be used in embodiments of the present invention.
Figure 8:
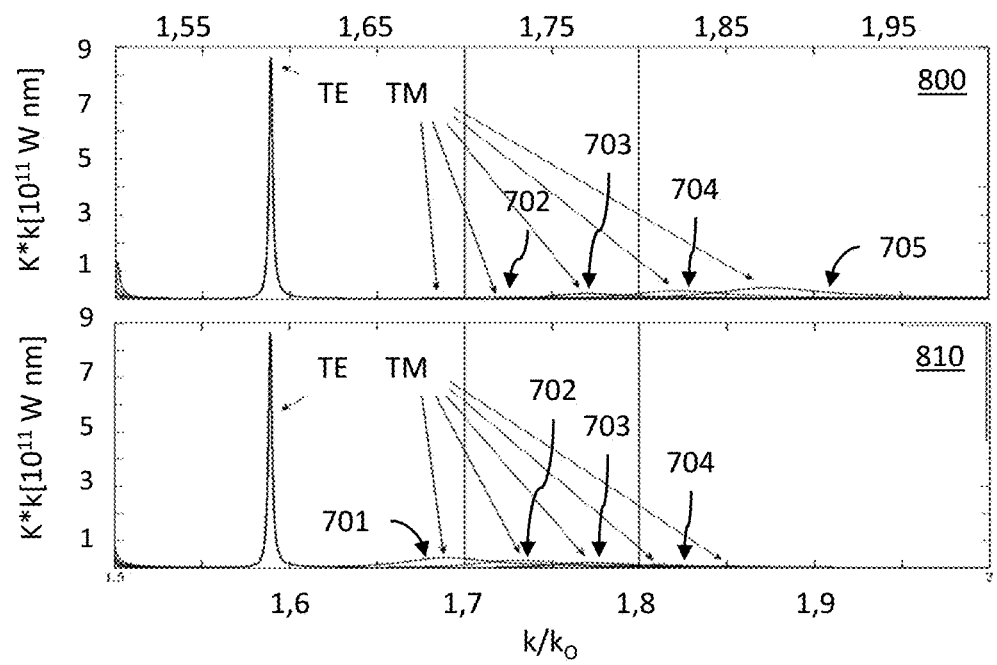
FIG. 8 shows two graphs illustrating a simulation of an emission distribution with horizontal dipole orientation, for ETL and HTL, as can be used in embodiments of the present invention.
Figure 9:
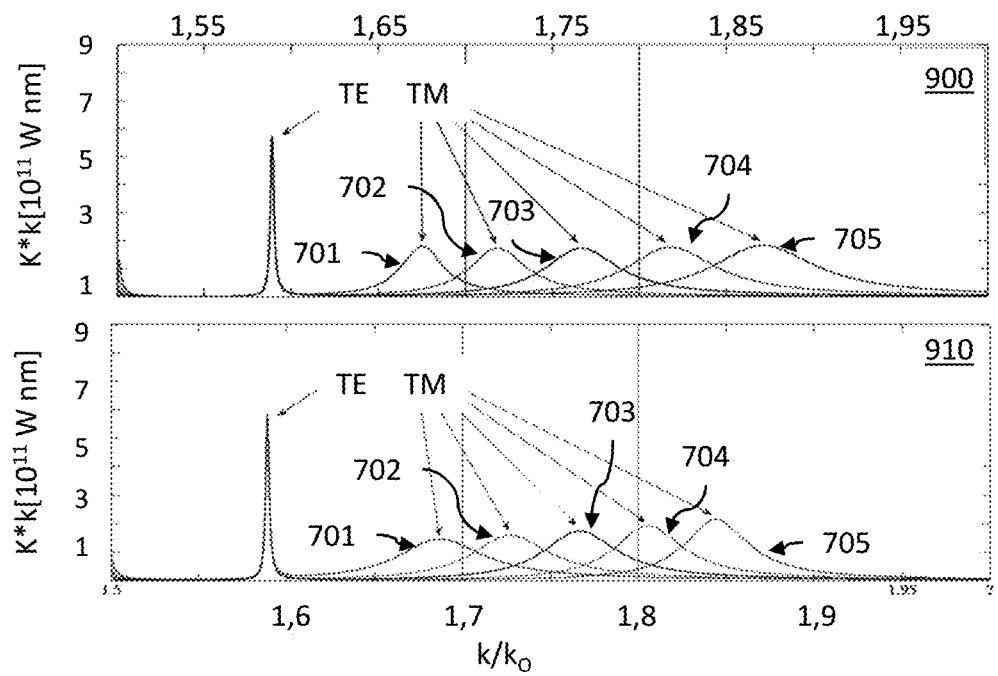
FIG. 9 shows two graphs illustrating a simulation of an emission distribution with random dipole orientation, for ETL and HTL, as can be used in embodiments of the present invention.

FIG. 7 to FIG. 9 show the emission of the dipoles in k-space for different orientations of dipoles and different values of $n_E$, the peaks corresponding to the Transverse Electric (TE) and Transverse Magnetic (TM) emission. In the graphs, K is the power flux per unit ($\kappa^2$) in +z and −z directions in the plane of the emitter and κ designates the component of the wavevector parallel to the interfaces.

The figures are constructed in such a way that the surface area under the curve scales with the total emitted power for the corresponding values of κ.

FIG. 7 shows two graphs with the emission distribution with vertical dipole orientation, for ETL 700 and HTL 710. The first TM peak 701 corresponds with $n_E$=1.5, the second peak 702 with $n_E$=1.6, the third peak 703 with $n_E$=1.7, the fourth peak 704 with $n_E$=1.8, and the fifth peak 705 with $n_E$=1.9.

FIG. 8 shows two graphs with the emission distribution with horizontal dipole orientation, for ETL 800 and HTL 810. The TM peaks correspond to the same $n_E$ values as in FIG. 7 (one peak is too small to be indicated in the image).

FIG. 9 shows two graphs with the emission distribution with random dipole orientation, for ETL 900 and HTL 910. The TM peaks correspond to the same $n_E$ values as in FIG. 7 (one peak is too small to be indicated in the image).

Changing the value of $n_E$ only has significant influence on the emission for values of $\kappa/k_0$ greater than 1.5 (hence values lower than 1.5 are not shown). The TE peak between 1.55 and 1.6 is not influenced by $n_E$ because TE is function of $n_O$. Emission with $\kappa/k_0$ greater than 1.5 cannot propagate in the glass substrate and is thus trapped inside the organic stack and lost. Using this observation the trapped power $P_{trapped}$ can be defined as $$P_{trapped} = \int\!\!\!\int_{1.5 \cdot k_0}^{+\infty} K d\kappa^2 = \int_0^{2\pi} d\varphi \int_{1.5 \cdot k_0}^{+\infty} K \cdot \kappa d\kappa = 2\pi \int_{1.5 \cdot k_0}^{+\infty} K \cdot \kappa d\kappa$$

Figure 10:
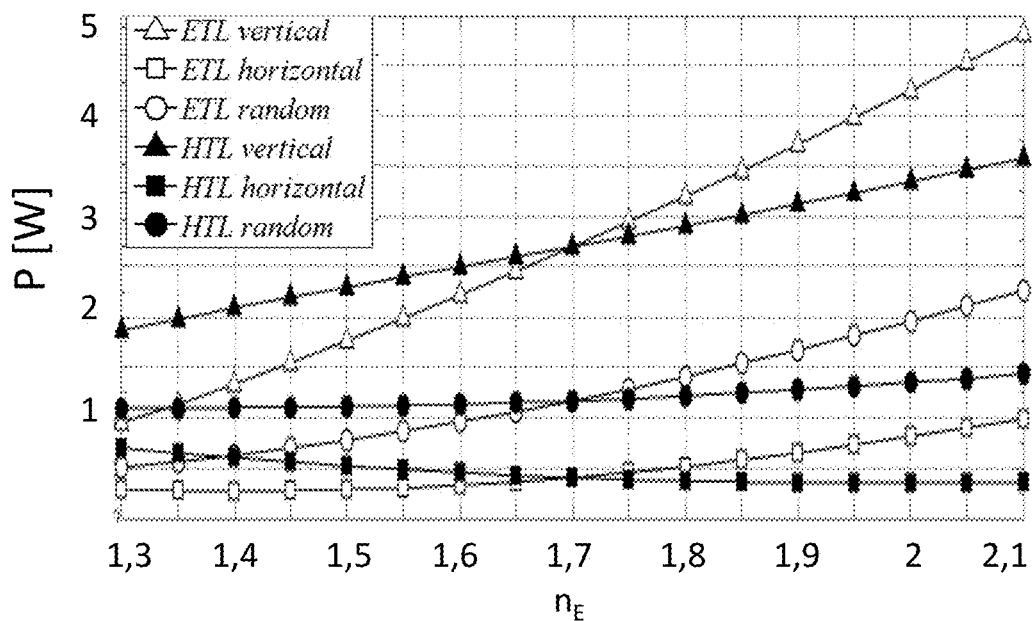
FIG. 10 shows $P_{trapped}$ for the three different dipole orientations, while the values for $n_E$ of the HTL and ETL are varied between 1.3 and 2.1, as can be used in embodiments of the present invention.

FIG. 10 shows $P_{trapped}$ for the three different dipole orientations, while the values for $n_E$ of the HTL and ETL are varied between 1.3 and 2.1, showing the radiation pattern of the dipoles as a function of $n_E$. For the ETL, lowering the value of $n_E$ reduces the radiation emitted into these trapped directions, especially for vertically oriented emitters, which is to be expected since vertically oriented emitters emit a larger portion of their total emission into trapped directions. For the horizontally and randomly oriented emitters the trend is similar, hence low values of $n_E$ are effective in lowering $P_{trapped}$. For the HTL, lowering $n_E$ has an opposing effect on horizontal and vertical emitters. Lowering the value of $n_E$ results in a decrease in $P_{trapped}$ for vertical emitters whereas it results in an increase in $P_{trapped}$ for horizontal emitters. Consequently the effect on random emitters is almost non-existent. In a device that comprises the superior horizontal emitters, materials with high values for $n_E$ are advantageous.

Reducing $n_E$ reduces losses, in case of ETL, due to the narrowing of the plasmonic loss peak in the emission spectrum. The loss from the vertically oriented dipoles reduced the most, since they couple more strongly to the plasmonic modes. For the HTL it depends on the dipole orientation. Horizontally oriented emitters show less losses for high values of $n_E$, while vertically oriented emitters show less losses for low values. Hence, horizontally oriented emitters with a HTL with high $n_E$ and low $n_O$ are advantageous.

The combined effect of the refraction indices of ETL and HTL affect the outcoupling efficiency. Variations of anisotropy $\Delta n$, while keeping the (averaged) isotropic refractive index $n_{iso}$ constant, are shown in FIG. 11 to FIG. 16. These values are defined as:

$$\Delta n = n_e - n_o,$$

$$n_{iso} = \left[\frac{2n_o^2 + n_e^2}{3}\right]^{1/2}.$$

The isotropic refractive index of the materials is kept constant ($n_{iso}$=1.7).

A grid of nine sets of refractive indices is used, with three values for $\Delta n_{ETL}$ and three values for $\Delta n_{HTL}$. For each configuration the thicknesses of the ETL and HTL layers are optimized for maximum outcoupling efficiency. By optimizing the thicknesses for each configuration (which are different in case of vertical, horizontal and vertical configurations), the obtained outcoupling efficiency is the highest possible value corresponding to the structure with optimized interference effects. Additionally, the full angle dependency, polarization and interference effects are taken into account for the nine given sets of anisotropy. The results for different orientations of the emitting dipoles are analyzed. Both horizontal and vertical dipoles, and from these the emission in case of random orientation of the dipoles, can be determined. The outcoupling efficiency $\eta_{out}$ is defined as $$\eta_{out} = \frac{\int_0^\infty K_{sub} d\kappa^2}{\int_0^\infty K_{EML} d\kappa^2}$$

where $K_{sub}$ and $K_{EML}$ are respectively the power flux per unit $\kappa^2$ in the +z-direction in the substrate and (in +z and -z directions) in the plane of the emitter. This is the value which is optimized for the different sets of refractive indices. The normalized total power generated by a dipole antenna F is defined as $$F = \frac{\int_0^\infty K_{EML} d\kappa^2}{\int_0^\infty K_{inf} d\kappa^2}$$

where $K_{inf}$ is the power flux per unit $\kappa^2$ of a dipole in +z and -z directions when it is located in an infinite medium with the optical characteristics of the EML ($n_E$=$n_O$=1.7).

From the value of F and the decay characteristics of specific emitters in a thick EML layer, the radiative efficiency of the dipole in the specific stack can be determined:

$$\eta_{rad} = \frac{F \cdot \Gamma_{r,0}}{F \cdot \Gamma_{r,0} + \Gamma_{nr}}$$

where $\Gamma_{r,0}$ is the radiative fraction of the decay rate in an infinite EML medium and $\Gamma_{nr}$ is the non-radiative fraction of the decay rate in an infinite EML medium, with $\Gamma_{r,0}+\Gamma_{nr}$=1

From the outcoupling efficiency $\eta_{out}$ and the radiative efficiency $\eta_{rad}$ the external quantum efficiency (EQE) is calculated:

$$EQE_{sub} = \frac{N_{ph,sub}}{N_{h^+}} = \eta_{cb}\eta_{st}\eta_{rad}\eta_{out}$$

with $N_{ph,sub}$ the number of photons reaching the substrate, $N_{h^+}$ the number of injection holes, $\eta_{cb}$ the charge balance efficiency (assumed to be unity) and $\eta_{st}$ the singlet/triplet efficiency. In some embodiments comprising fluorescent emitter, this value is 0.25, while for phosphorescent emitters, the value is unity. As long as the fraction of non-radiative decay is negligible ($\Gamma_{nr} \ll 1$), F is non-critical for the $EQE_{sub}$. However, if $\Gamma_{nr}$ is large, it is beneficial to have a higher value for F to increase the EQE. The values of F will be given only for the horizontal orientation of dipoles, but $n_O$ assumptions will be made concerning $\Gamma_{nr}$. Note that $EQE_{sub}$ will be identical to $\eta_{out}$ in case a phosphorescent emitter with 100% efficiency is used with perfect charge balance.

Figure 11:
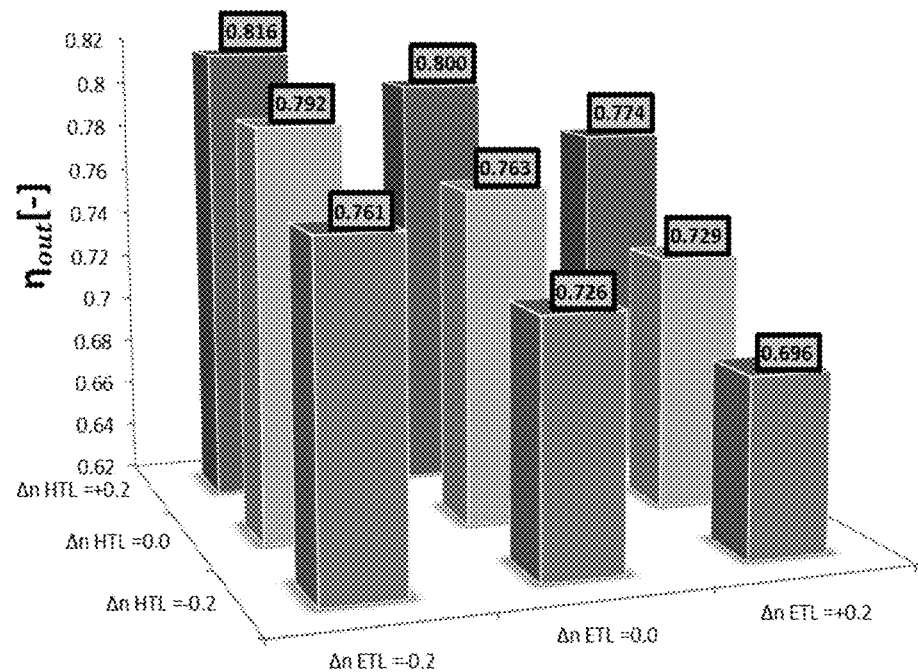
FIG. 11 shows the outcoupling efficiency for several anisotropic values of the refraction indices combined for the ETL and HTL for the vertical dipole orientation, as can be used in embodiments of the present invention.
Figure 12:
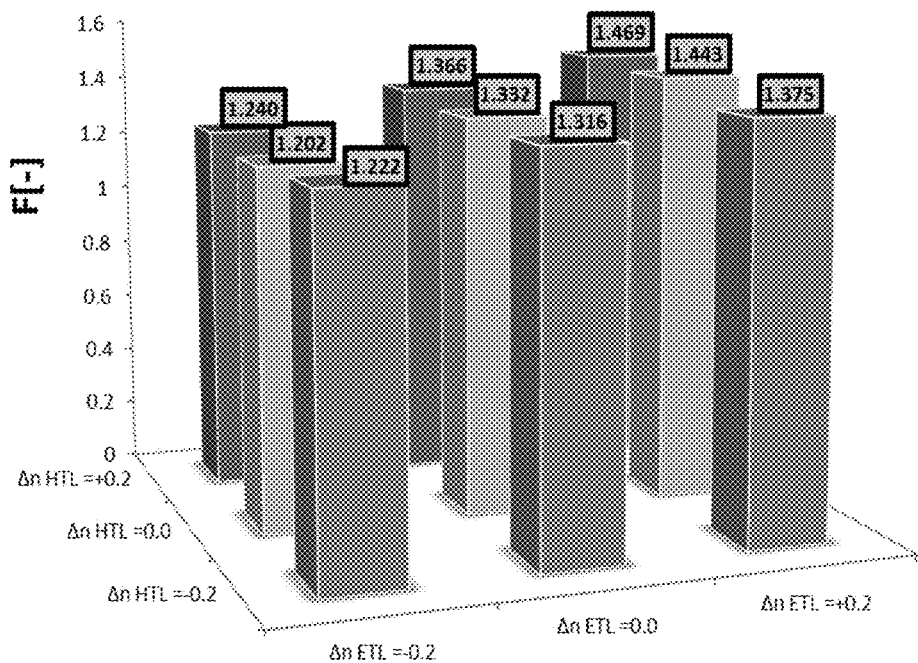
FIG. 12 shows the F for several anisotropic values of the refraction indices combined for the ETL and HTL for the vertical dipole orientation, as can be used in embodiments of the present invention.

FIG. 11 shows the outcoupling for horizontal orientation of dipoles. The structure is optimized for horizontally oriented dipoles using the outcoupling efficiency as a goal function. FIG. 12 shows the function F for the same orientation. Horizontally oriented dipoles with optimized anisotropy for the HTL and ETL the maximum outcoupling efficiency increases by 7% (and a suboptimal choice may lead to a 9% decrease). Negatively anisotropic materials for ETL give the best result (in line with the advantageous small value for $n_E$ inferred from FIG. 10). Hence, negatively anisotropic layers are optimal for the ETL. For the HTL layer, as it can be inferred from FIG. 10 and FIG. 3, positive anisotropy will boost outcoupling efficiency for a low $n_O$ and high $n_E$, as actually observed in the simulations of FIG. 11.

In FIG. 12, the values of F show an opposite trend, which can be attributed to an increased coupling to plasmonic modes boosting the total emission and thus the value for F. For emitters with high $\Gamma_{nr}$ a higher value of F helps to increase the $EQE_{sub}$ although this will have little impact on highly efficient emitters ($\Gamma_{nr} \ll 1$). The trend is similar in the vertical dipole orientation and random dipole orientation.

Figure 13:
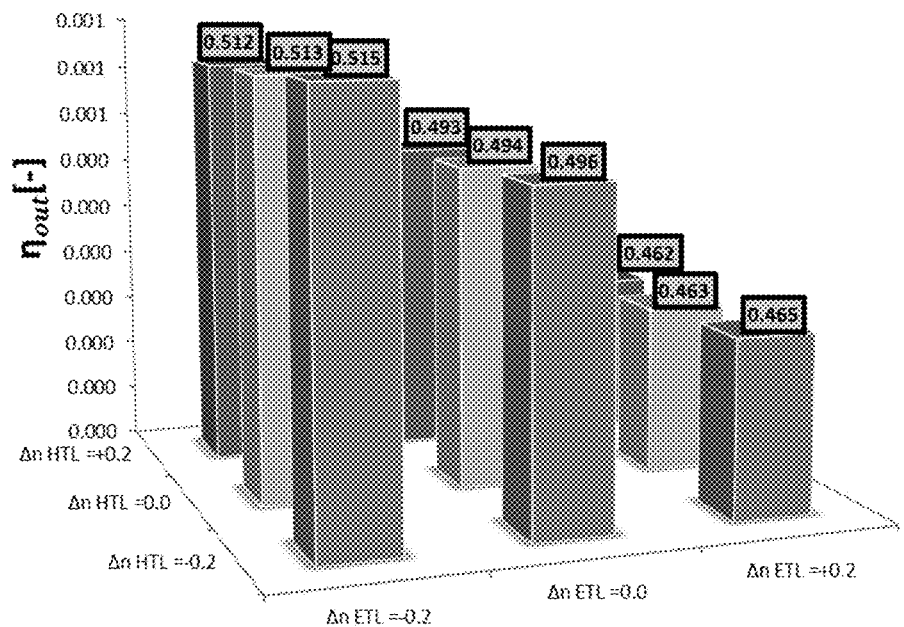
FIG. 13 shows the outcoupling efficiency for several anisotropic values of the refraction indices combined for the ETL and HTL for the horizontal dipole orientation, as can be used in embodiments of the present invention.

FIG. 13 shows the outcoupling for vertical orientation of dipoles. Smaller values for the outcoupling efficiency are obtained. As before, the structure has been optimized for vertically oriented dipoles using the outcoupling efficiency as a goal function. For vertically oriented dipoles a good choice of anisotropic materials gives a 4% increase in maximum outcoupling (and a maximum 6% decrease for suboptimal). For the ETL the conclusions are the same as for horizontally oriented dipoles (negatively anisotropic materials are advantageous). For the HTL however the conclusions are opposing, here a positively anisotropic material will give slightly better results. As also seen in FIG. 10, in the case of vertically oriented emitters, low values for $n_E$ improve outcoupling.

Figure 14:
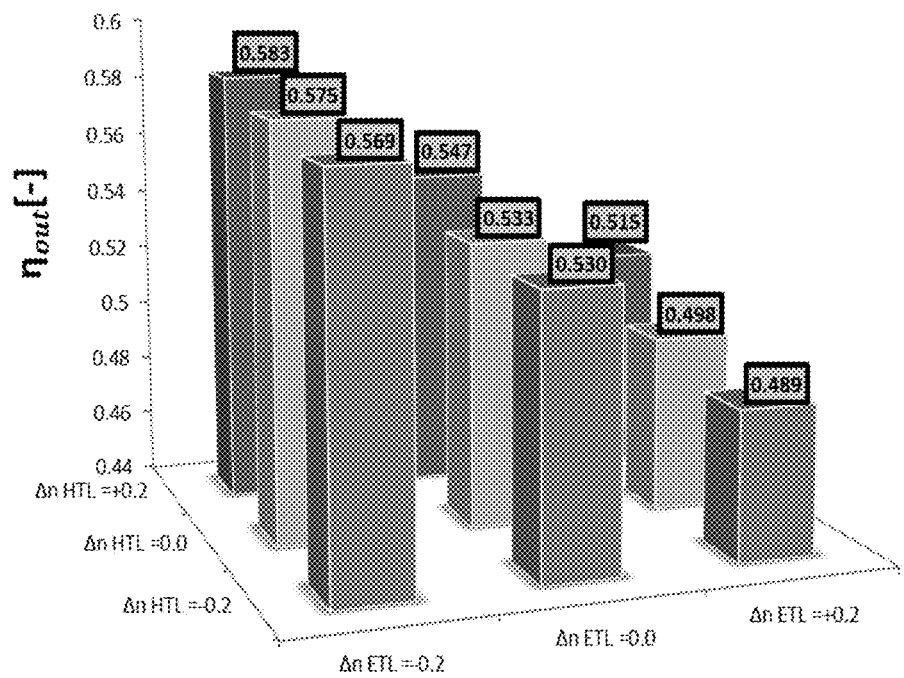
FIG. 14 shows the outcoupling efficiency for several anisotropic values of the refraction indices combined for the ETL and HTL for random dipole orientation, as can be used in embodiments of the present invention.

FIG. 14 presents the outcoupling for random orientation of dipoles. As before, the structure has been optimized for vertically oriented dipoles using the outcoupling efficiency as a goal function. For randomly oriented dipoles, the optimal choice of anisotropic materials would increase the maximum outcoupling efficiency by 9% (and a suboptimal choice may decrease it by 8%) For randomly oriented emitters there is a very strong dependency on the ETL anisotropy, where negatively anisotropic materials give the best results (as observed before). For the HTL the dependency is weaker, and positively anisotropic materials perform best.

For horizontal dipoles, HTL and ETL have opposing anisotropic requirements for outcoupling optimization. The ETL layer increase outcoupling efficiency when negatively anisotropic, whereas the negatively anisotropic HTL layers give a decrease in outcoupling efficiency. For ETL, the value of $n_O$ has a small effect on the vertical emission, and low values corresponds to slightly better performance. On the other hand, $n_E$ has a strong effect on the amount of power that is radiated into trapped modes. Low values for $n_E$ lower the amount of power radiated into these trapped modes. Hence, for the ETL both the $n_E$ and no should be as low as possible. The effect of $n_E$ is much larger, hence negatively anisotropic materials are most advantageous for ETL. Horizontal dipoles show higher outcoupling efficiencies in general, due to their emission pattern, and are consequently of interest for highly efficient OLEDs. Negatively anisotropic ETL layers have a positive effect on outcoupling efficiency for horizontal dipoles (FIG. 11). For the HTL, low values for no have a positive effect on vertical emission and high values of $n_E$ decrease emission into trapped modes, improving outcoupling. These opposing requirements can never be met with isotropic materials. Positively anisotropic HTL layers are beneficial for extraction efficiency For vertical dipoles the requirements are different than for horizontal dipoles. For vertical dipoles low values of $n_E$ are desirable for both the ETL and HTL layer. Negative anisotropy is desirable for both the ETL and HTL layer (FIG. 13). The effect of the HTL layer is notably smaller than the effect of the ETL. This is due to the fact that vertical emitters emit at angles near to the vertical direction, where the effect of high $n_O$ will negatively affect the outcoupling efficiency.

For random dipoles the effects are a combination of the vertical and horizontal dipoles. The horizontal dipoles will have double the weight of vertical dipoles due to symmetry. In addition to this the interference effects are optimal for different layer thicknesses in the case of horizontal and vertical emitters. This in combination with the fact that the inherent emission pattern for horizontal dipoles shows higher extraction efficiencies leads to the fact that the requirements for random dipoles are very similar to the requirements for horizontal dipoles. For random dipoles, negative anisotropy for the ETL layer has a significant impact on extraction efficiency whereas the impact of using a positively anisotropic layer for the HTL is only minor.

In some advantageous embodiments of the present invention, an OLED comprises a negatively anisotropic ETL layer, horizontal emitters and a HTL with positive anisotropy.

Those skilled in the art may follow a similar procedure of optimization for other materials and layers, for additional layers like hole-blocking and electron-blocking layers, or for example for birefringent substrates, for anisotropic EMLs, for OLEDs with transparent substrate, QDLEDs, etc. For example, materials with variable anisotropy may be used, and dynamic control of outcoupling (and hence brightness, gamma, contrast, etc) may be controlled at a single pixel level, where possible.

Figure 15:
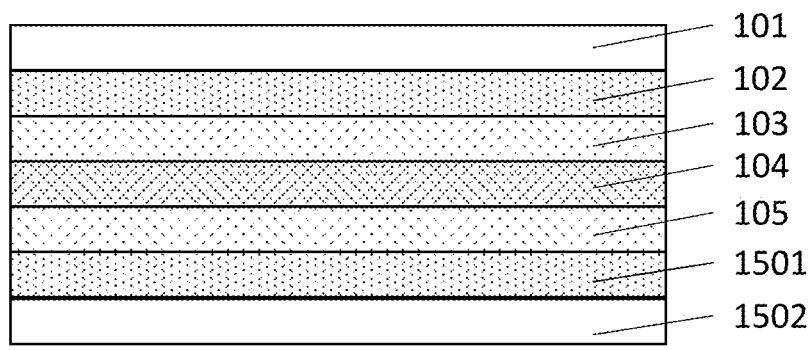
FIG. 15 shows an alternative layered stack according to certain embodiments of the present invention.

For example, a similar approach can be used to obtain the optimal outcoupling efficiency in the transparent OLED structure 1500 shown in FIG. 15, comprising the same substrate 101, anode 102, HTL 103, EML 104, ETL 105, but the cathode 1501 may be transparent instead of blocking the light, as in FIG. 1. This cathode 1501 may also be attached to a second substrate 1502, although the present invention is not limited thereto and the second substrate layer 1502 may be not necessary.

In a further aspect, the present invention relates to a method of manufacture of an OLED according to the first aspect of the present invention. The method comprises depositing a first electrode, a hole transport layer, an emissive layer, an electron transport layer and a second electrode, wherein depositing an emissive layer comprises depositing an emissive layer comprising horizontally oriented emitters oriented parallel with the interfaces between the different layers or randomly oriented emitters being a mixture of emitters oriented in parallel and oriented perpendicular to the interfaces between the different layers and depositing a hole transporting layer comprises depositing a hole transport layer having a refractive index with positive anisotropy. In some embodiments depositing an electron transport layer comprises depositing an electron transport layer (105) having a refractive index with negative anisotropy.

For example, a conductive layer of a transparent conductive material can be deposited on a substrate for forming the anode. For example, a layer of ITO, FTO or any other suitable transparent conductor oxide may be deposited by vacuum thermal evaporation, vapour deposition, inkjet printing, etc. Materials with a low work function are advantageous in OLEDs, but the present invention is not limited thereto, and a conductive layer may also be obtained by deposition of a thin layer of metal like gold, silver, etc.

Deposition of organic layers for charge carrier transport layers should ensure anisotropic optical properties according to embodiments of the first aspect of the present invention. For example, small molecules like Tris (8-hydroxyquinolinato) aluminum (Alq3) can be deposited by evaporation, or polymers by spin deposition. For example, in order to ensure anisotropy, the deposited surface should be heated during deposition. The heating temperature thereby advantageously is at or above the glass transition temperature of the material being deposited. For BSB-CZ the glass transition temperature is for example 116° C. It is to be noticed that heating after deposition also can have an influence. The EML between the HTL and ETL can also be deposited, evaporated, printed, grown, etc, depending of the type of layer.

For example, deposition of organic material on a heated anode may form the HTL, followed by deposition of the electroluminescent material thus obtaining the EML, heating the stack, and then a deposition of organic material may form the ETL. The method may comprise other steps, for example depositing the cathode, or depositing extra layers like charge carrier blocking layers.

It is to be noted that deposition techniques for the different layers as such are known by the person skilled in the art. Features of embodiments of the present invention rather lie in the fact that the specific layers that are deposited are selected such that these have the specific optical properties as indicated above.

Figure 16:
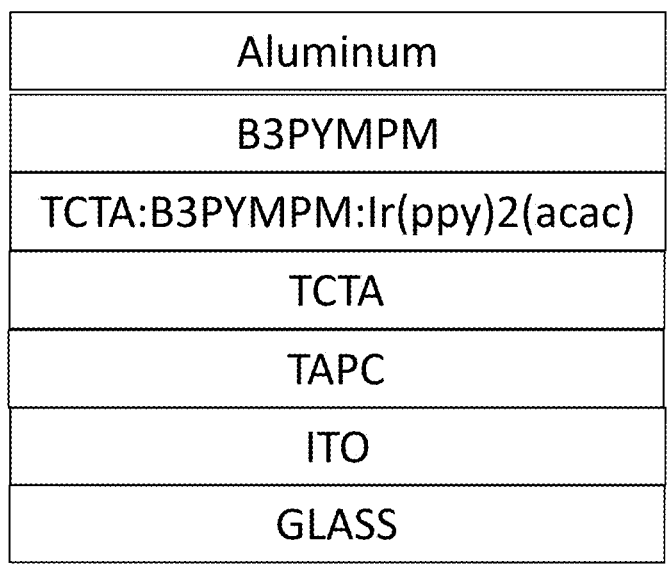
FIG. 16 shows an example of a real-life OLED structure as used for illustrating benefits of embodiments according to the present invention.
Figure 17:
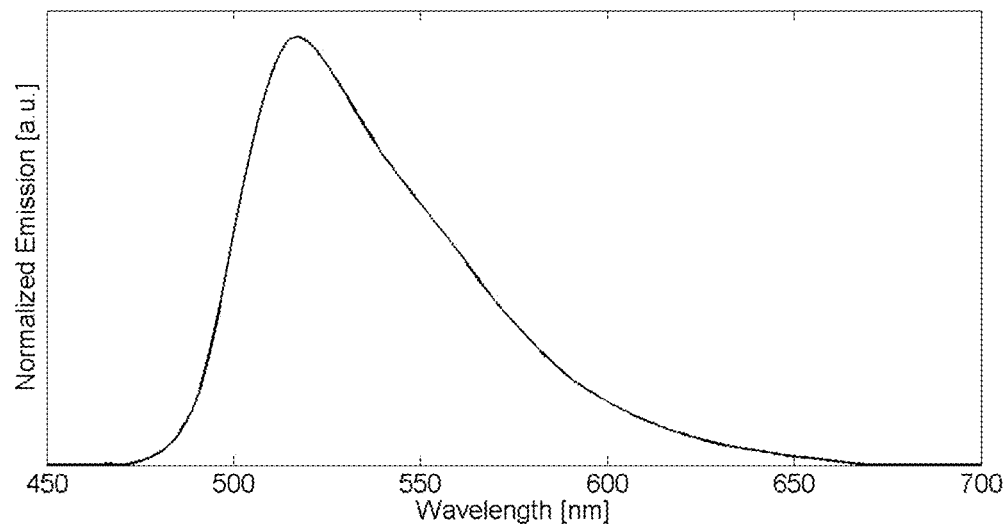
FIG. 17 illustrates the normalized emission spectrum of Ir(ppy)2(acac) used in the simulations for the OLED structure as shown in FIG. 16.
Figure 18:
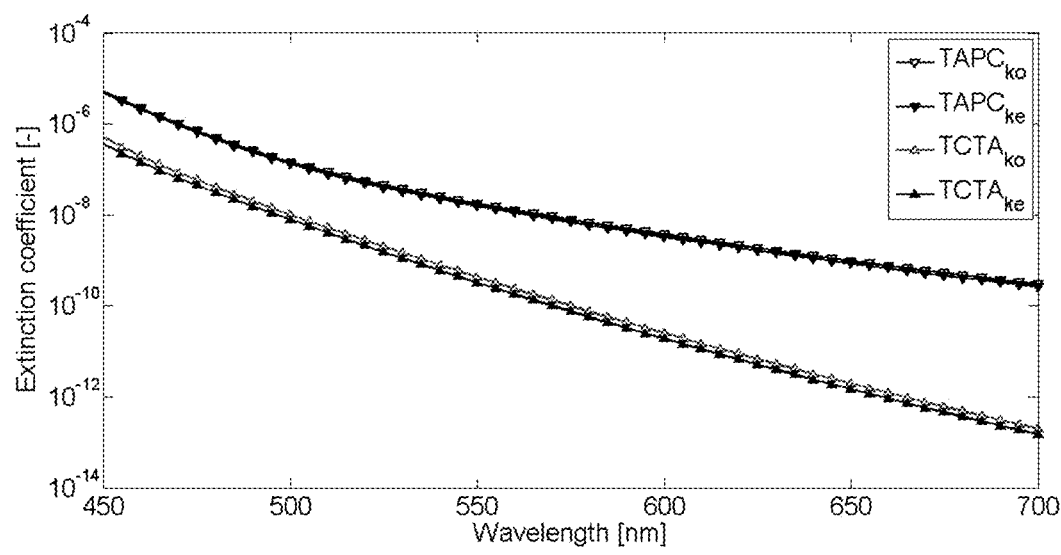
FIG. 18 and FIG. 19 illustrate respectively the extinction coefficients and the refractive index of the organic layers (the extinction coefficient of ITO is not shown since it is neglectable), used in the simulations for the OLED structure as shown in FIG. 16.
Figure 19:
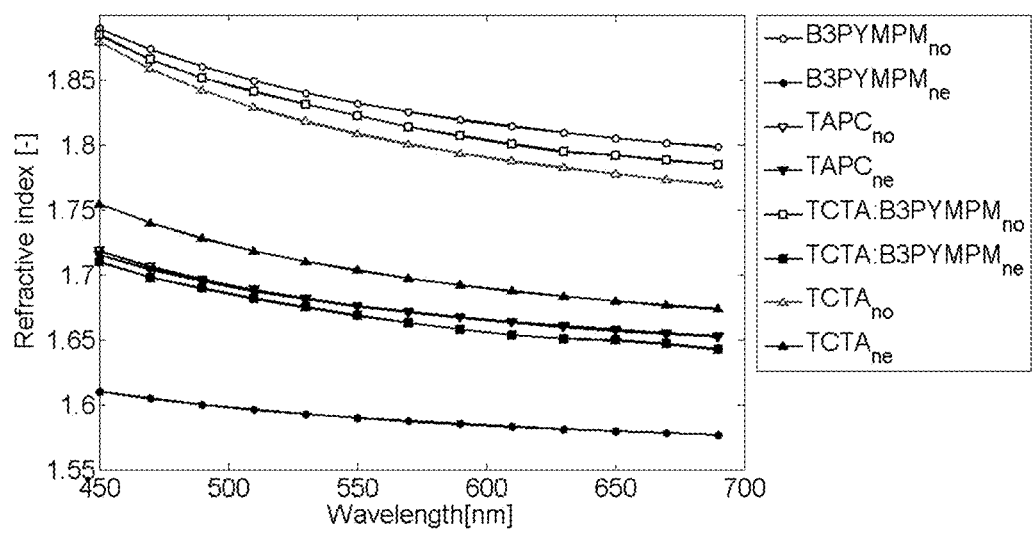
Figure 20:
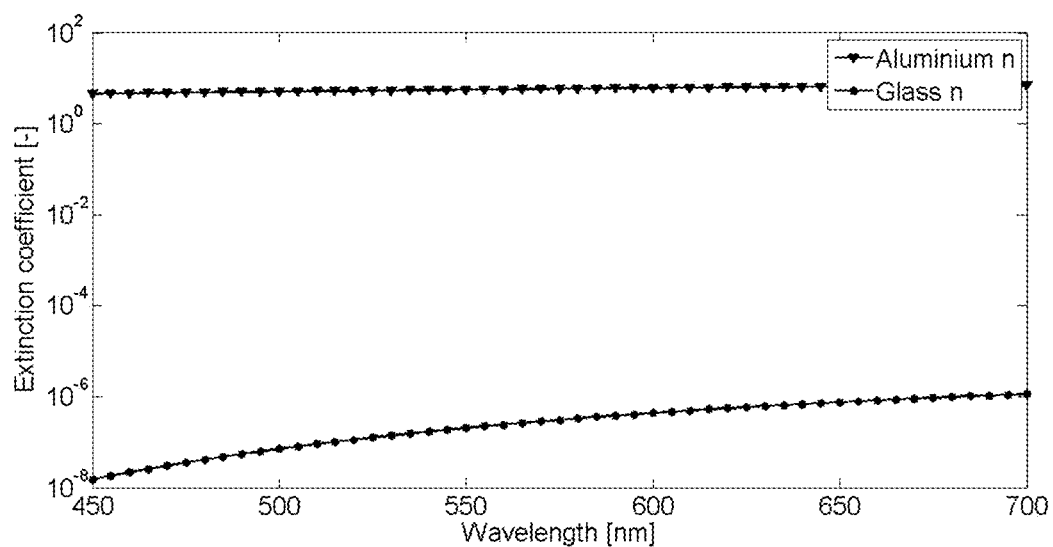
FIG. 20 and FIG. 21 illustrate respectively the extinction coefficients and the refractive indices of the inorganic layers, as used in the simulations.
Figure 21:
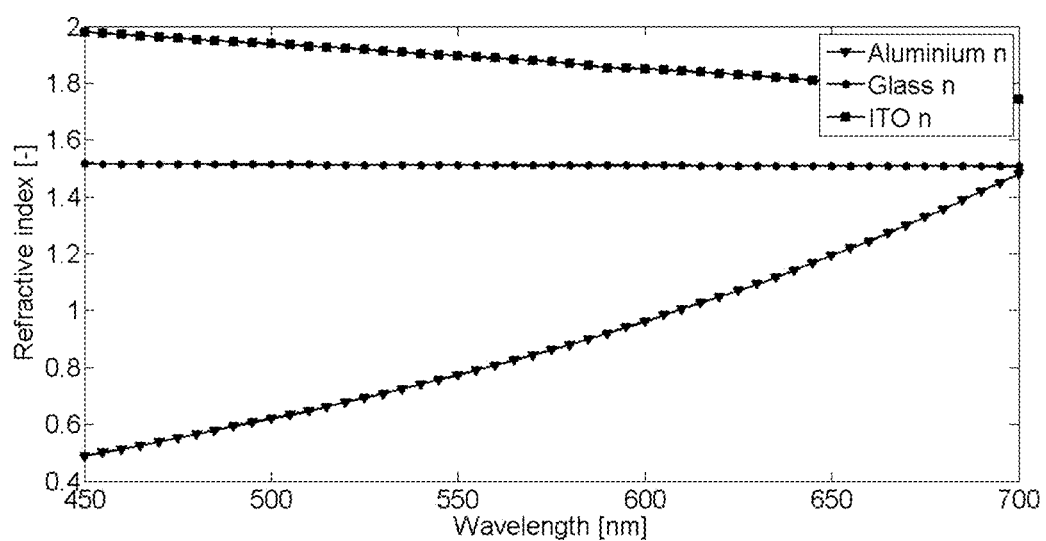

By way of illustration, embodiments of the present invention not being limited thereto, the effect of anisotropy is illustrated for a known OLED structure. In the below discussion, the OLED structure as described by Kim et al. in Advanced Functional Materials, 23(31), 3896-3900 is used. It consists of an ITO electrode, a TAPC and TCTA hole transport layer, an emissive layer TCTA:B3PYMPM:IR (ppy)2(acac) a B3PYMPM electron transport layer and an Aluminum electrode. Such a structure is shown in FIG. 16. The emitters in this OLED have a preferred horizontal orientation; It was described by Kim et al. that 77% of the emitters are oriented horizontally and 23% oriented vertically, so the emitters are oriented predominantly parallel to the layers. The refractive indices, extinction coefficients and the emission spectrum used in the simulations are shown in FIG. 17 to FIG. 21.

As indicated above, for a device with horizontally oriented emitters the layers transporting the holes should have a positive anisotropy and the layers transporting the electrons should a negative anisotropy. In this example this means that the B3PYMPM layers should have negative anisotropy and the TAPC and TCTA layers should have a positive anisotropy. The anisotropy of the different layers can be altered, e.g. by using different deposition processes. As indicated above, it is assumed that the orientation factor of the emitters is 0.77 and the photoluminescent quantum yield is $q_{pl}$=0.94, taken from the publication from Kim et al.

In a first version of the device, the B3PYMPM layer is chosen negatively anisotropic. The TCTA layers is chosen negatively anisotropic and the TAPC layer is chosen isotropic. This device is capable of a maximum optical outcoupling of 31.74% [glass/ITO (70 nm)/TAPC (74 nm)/TCTA (10 nm)/TCTA:B3PYMPM:Ir(ppy)2(acac) (1:1 molar ratio and 8 wt %) (30 nm)/B3PYMPM (34 nm)/Al (100 nm)] when the thickness of the B3PYMPM layer and the TAPC layer are optimized.

If the B3PYMPM layer is made isotropic rather than anisotropic, the maximum outcoupling efficiency would drops to 29.69% [glass/ITO (70 nm)/TAPC (72 nm)/TCTA (10 nm)/TCTA:B3PYMPM:Ir(ppy)2(acac) (1:1 molar ratio and 8 wt %) (30 nm)/B3PYMPM (37 nm)/Al (100 nm)]. This drop is due to the lack of a negatively anisotropic electron transport material. To calculate the refractive index of the isotropic layer, $$n_{iso} = \left[\frac{2n_o^2 + n_e^2}{3}\right]^{\frac{1}{2}},$$

is used for each wavelength.

If the TAPC layer was negatively anisotropic ($\Delta n$=−0.2, n_iso=n_TAPC), rather than isotropic, the maximum outcoupling efficiency would drop to 30.15% [glass/ITO (70 nm)/TAPC (70 nm)/TCTA (10 nm)/TCTA:B3PYMPM:Ir (ppy)2(acac) (1:1 molar ratio and 8 wt %) (30 nm)/ B3PYMPM (35 nm)/Al (100 nm)]. This drop in efficiency (from 31.74% to 30.15%) is as predicted and an increase is expected when TAPC has a positive anisotropy. To calculate the negatively anisotropic layer we fix the value of $n_{iso}$ and vary the value of $\Delta n = n_e - n_o$ for each wavelength.

A device with a positively anisotropic TAPC layer ($\Delta n$=+ 0.2, n_iso=n_TAPC), indeed has a maximum outcoupling efficiency of 33.36% [glass/ITO(70 nm)/TAPC(77 nm)/ TCTA(10 nm)/TCTA:B3PYMPM:Ir(ppy)2(acac) (1:1 molar ratio and 8 wt %) (30 nm)/B3PYMPM (32 nm)/Al (100 nm)].

With respect to the TCTA layer, according to embodiments of the present invention this advantageously should be positively anisotropic according to our predictions. If this layer is given the same refractive indices as the positively anisotropic TAPC layer (equivalent to omitting this layer), a maximum outcoupling efficiency of 34.2% [glass/ITO (70 nm)/TAPC (89 nm)/TCTA:B3PYMPM:Ir(ppy)2(acac) (1:1 molar ratio and 8 wt %) (30 nm)/B3PYMPM (34 nm)/Al (100 nm)] is achieved. This is to be expected since the negative anisotropy of the TCTA layer discussed in the first version of the device is detrimental to the outcoupling efficiency. This configuration corresponds to the best case scenario according to an embodiment of the present invention, i.e. positively anisotropic HTL and negatively anisotropic ETL.

As a last situation a worst case scenario is shown for comparison reasons. Here the ETL is positively anisotropic and the HTL is negatively anisotropic. Again $n_{iso}$ is kept constant for each layer and the TAPC layer is omitted. $\Delta n$=−0.2 is chosen for the TCTA layer and $\Delta n$=+0.2 for the B3PYMPM layer. The maximum outcoupling efficiency one can achieve with this stack is equal to 26.71% [glass/ITO (70 nm)/TAPC (77 nm)/TCTA:B3PYMPM:Ir(ppy)2(acac) (1:1 molar ratio and 8 wt %) (30 nm)/B3PYMPM (44 nm)/Al (100 nm)].

The above simulations of the real-life structure show that between the best and worst case scenario there is a difference of 7.49%, which is very significant since the standard device only has an outcoupling efficiency of 31.74%. This practical example clearly shows the importance of the proper use of anisotropic layers in OLED devices.

As indicated above, the selection between isotropic, negative anisotropic or positive anisotropic can for example be made by altering the deposition conditions for the layer and the molecules contained therein. For oblong molecules it has for example been shown that they orient perpendicular to the substrate when heated above their glass temperature, as described for example in Yokoyama et al. in Journal of Applied Physics (2010), 107(12). For hole transport materials this can for example be done for the very popular and oblong molecule TPD. When TPD is deposited at high rates or on a heated substrate the layer has a positive anisotropy.

It has to be noticed that an increase in hole and/or electron mobility is usually associated with the horizontal orientation of molecules as described for example in Yokoyama et al. Applied Physics Letters, (2009), 95(24), which further strengthens the fact that one should strive to design negatively anisotropic electron transport layers. On the other hand, this means that positively anisotropic hole transport materials might be accompanied by an unwanted drop in mobility. This drop in mobility can easily be compensated for by doping the organic semiconductors, much like their inorganic counterparts, as discussed by Lüssem et al. in Physica Status Solidi A Applications and Materials Science 210 (2013). In other words, electrical effects of the selection made for the different layers in view of their optical properties, can be compensated for by further altering the electrical characteristics. This can for example be done by doping in such a way that it has little or no effect on the optical properties.

The invention claimed is:

1. An Organic Light Emitting Diode for emitting radiation, the organic light emitting diode comprising:
    a hole transport layer,
    an emissive layer, wherein the emissive layer comprises horizontally oriented emitters whereby the horizontally oriented emitters are oriented parallel with an interface between the hole transporting layer and the emissive layer or randomly oriented emitters whereby a mixture of emitters oriented in parallel and emitters oriented perpendicular to the interface between the hole transporting layer and the emissive layer occurs, and an electron transport layer,
    wherein the hole transport layer is made of a material having a refractive index having a positive anisotropy, such that a difference in refractive index between an extra-ordinary refractive index and an ordinary refractive index is positive.

2. The Organic Light Emitting Diode according to claim 1, wherein the positive anisotropy is at least 0.1.

3. The Organic Light Emitting Diode according to claim 1, wherein a structure of the Organic Light Emitting Diode is a bottom emitting structure comprising a transparent substrate and the structure of the Organic Light Emitting Diode is emitting through the transparent substrate.

4. The Organic Light Emitting Diode according to claim 1, wherein the horizontally oriented emitters or the randomly oriented emitters are organic dipole emitters.

5. The Organic Light Emitting Diode according to claim 1, wherein the horizontally oriented emitters or the randomly oriented emitters are nano crystalline quantum dots.

6. The Organic Light Emitting Diode according to claim 1, wherein the electron transport layer is made of a material having a refractive index having a negative anisotropy.

7. The Organic Light Emitting Diode according to claim 6, wherein the negative anisotropy is at least −0.1.

8. An optical appliance comprising the Organic Light Emitting Diode according to claim 1.

9. An Organic Light Emitting Diode for emitting radiation, the organic light emitting diode comprising:
    a hole transport layer,
    an emissive layer, wherein the emissive layer comprises horizontally oriented emitters whereby the horizontally oriented emitters are oriented parallel with an interface between the hole transporting layer and the emissive layer or randomly oriented emitters whereby a mixture of emitters oriented in parallel and emitters oriented perpendicular to the interface between the hole transporting layer and the emissive layer occurs, and
    an electron transport layer,
wherein the hole transport layer is made of a material having a refractive index having a positive anisotropy, such that a difference in refractive index between an extra-ordinary refractive index and an ordinary refractive index is positive, the hole transport layer being deposited at a surface deposition temperature higher than a glass transition temperature of the material of the hole transport layer.

10. The Organic Light Emitting Diode according to claim 9, wherein the material of the hole transport layer comprises 4, 4'-Bis (4-(9H-carbazol-9-yl) styryl) biphenyl, [1,3-Bis[2-(2,2'-bipyridine-6-yl)-1,3,4-oxadiazo-5-yl] benzene, or [4,6-Bis (3,5-di(pyridin-3-yl) phenyl)-2-methylpyrimidine].

* * * * *